United States Patent
Chan et al.

(10) Patent No.: US 11,682,591 B2
(45) Date of Patent: Jun. 20, 2023

(54) METHOD FOR FORMING TRANSISTOR STRUCTURES

(71) Applicant: IMEC VZW, Leuven (BE)

(72) Inventors: Boon Teik Chan, Wilsele (BE);
Juergen Boemmels, Heverlee (BE);
Basoene Briggs, Heverlee (BE)

(73) Assignee: IMEC Vzw, Leuven (BE)

( * ) Notice: Subject to any disclaimer, the term of this patent is extended or adjusted under 35 U.S.C. 154(b) by 0 days.

(21) Appl. No.: 17/409,964

(22) Filed: Aug. 24, 2021

(65) Prior Publication Data
US 2022/0068725 A1 Mar. 3, 2022

(30) Foreign Application Priority Data
Aug. 25, 2020 (EP) ..................................... 20192545

(51) Int. Cl.
*H01L 21/84* (2006.01)
*H01L 27/12* (2006.01)
(Continued)

(52) U.S. Cl.
CPC ........ *H01L 21/84* (2013.01); *H01L 21/76283* (2013.01); *H01L 27/1203* (2013.01); *H01L 29/775* (2013.01); *H01L 21/823878* (2013.01)

(58) Field of Classification Search
CPC ........... H01L 21/76283; H01L 27/1203; H01L 29/775; H01L 21/823481; H01L 29/673;
(Continued)

(56) References Cited

U.S. PATENT DOCUMENTS 9,984,936 B1 5/2018 Xie et al.
10,074,575 B1 9/2018 Guillorn et al.
(Continued)

OTHER PUBLICATIONS

P. Weckx et al., "Novel forksheet device architecture as ultimate logic scaling device towards 2nm,", 2019 IEEE International Electron Devices Meeting (IEDM), 2019, pp. 36.5.1-36.5.4, doi: 10.1109/IEDM19573.2019.8993635.
(Continued)

*Primary Examiner* — Thinh T Nguyen
(74) *Attorney, Agent, or Firm* — Moser Taboada

(57) ABSTRACT

According to an aspect of the present inventive concept there is provided a method for forming a first and a second transistor structure, wherein the first and second transistor structures are spaced apart by an insulating wall, and the method comprising:
  forming on a semiconductor layer of the substrate a first semiconductor layer stack and a second semiconductor layer stack, each layer stack comprising in a bottom-up direction a sacrificial layer and a channel layer, wherein the layer stacks are spaced apart by a trench extending into the semiconductor layer substrate, the trench being filled with an insulating wall material to form the insulating wall; and
  processing the layer stacks to form the first and second transistor structures in the first and second device regions, respectively, the processing comprising forming source and drain regions and forming gate stacks;
the method further comprising, prior to said processing:
  by etching removing the sacrificial layer of each layer stack to form a respective cavity on either sides of the insulating wall underneath the channel layer of the first and second layer stack, the channel layers being supported by the insulating wall; and
  depositing a bottom insulating material in said cavities;
(Continued)

wherein, subsequent to said processing, the bottom insulating material forms a bottom insulating layer underneath the source region, the drain region and the channel regions on either side of the insulating wall.

10 Claims, 9 Drawing Sheets

(51) Int. Cl.
    *H01L 29/775* (2006.01)
    *H01L 21/762* (2006.01)
    *H01L 21/8238* (2006.01)

(58) Field of Classification Search
    CPC ............... H01L 29/48654; H01L 21/84; H01L 29/66772
    USPC .......................................... 438/157; 257/347
    See application file for complete search history.

(56) References Cited

U.S. PATENT DOCUMENTS

| | | |
|---|---|---|
| 10,103,238 B1 | 10/2018 | Zang et al. |
| 2017/0133459 A1 | 5/2017 | Pranatharthiharan et al. |
| 2019/0393304 A1 | 12/2019 | Guillorn et al. |
| 2020/0083352 A1 | 3/2020 | Chanemougame et al. |
| 2020/0152734 A1 | 5/2020 | Frougier et al. |
| 2020/0227305 A1 | 7/2020 | Cheng et al. |
| 2020/0312956 A1* | 10/2020 | Yeh et al. ........... H01L 29/0653 |

OTHER PUBLICATIONS

European Search Report for EP Application No. 20192545 dated Jan. 13, 2021.

* cited by examiner

METHOD FOR FORMING TRANSISTOR STRUCTURES

CROSS-REFERENCE TO RELATED APPLICATIONS

The current application is a national phase application of European Application Number 20192545.0, filed Aug. 25, 2020, which patent documents are incorporated herein in their entireties.

TECHNICAL FIELD

The present inventive concept relates to a method for forming transistor structures.

BACKGROUND

Modern semiconductor integrated circuit technology includes horizontal channel transistors, of which the FinFET, which has a gate straddling a fin-shaped semiconductor channel portion, is one example. Other examples include the horizontal or lateral nanowire FET (NWFET) and nanosheet FET (NSHFET). These transistor structures typically include a source, a drain, a channel comprising one or more nanowire or nanosheet-shaped channel portions extending horizontally (i.e. along the substrate), and a gate stack. In a gate-all-around (GAA) design, the channel portions may extend through the gate stack such that the gate stack wraps all-around one or more of the channel portions.

The "forksheet" device is a design allowing an n-type NSHFET and a p-type NSHFET to be provided adjacent to each other, each controlled by a fork-shaped gate structure and separated by an insulating wall. The insulating wall may be formed between the p- and n-type device region before gate patterning. The wall may separate the p-gate trench from the n-gate trench, allowing a much tighter n-to-p spacing.

In horizontal channel transistor structures (e.g. the NWFET, the NSHFET and the forksheet), an electrical insulation, e.g. a "bottom insulation" may be needed to mitigate charge carrier leakage from e.g. the source, the drain or the channel into the underlying semiconductor substrate. Existing processing techniques may however be relatively complex and be challenging to apply at more aggressive device dimensions.

SUMMARY

An objective of the present inventive concept is to provide an improved method allowing providing an electrical insulation underneath a horizontal channel transistor structure. Further and alternative objectives may be understood from the following.

According to an aspect of the present inventive concept there is provided a method for forming a first and a second transistor structure in a first and a second device region of a substrate, respectively, each transistor structure comprising a source region, a drain region, a channel region extending between the source region and the drain region in a first direction along the substrate, and a gate stack at the channel region, wherein the first and second transistor structures are spaced apart in a second direction along the substrate, transverse to the first direction, by an insulating wall extending in the first direction, and the method comprising:

forming on a semiconductor layer of the substrate a first semiconductor layer stack in the first device region and a second semiconductor layer stack in the second device region, each layer stack comprising in a bottom-up direction a sacrificial layer and a channel layer, wherein the layer stacks are spaced apart by a trench extending into the semiconductor layer of the substrate, the trench being filled with an insulating wall material to form the insulating wall; and processing the layer stacks to form the first and second transistor structures in the first and second device regions, respectively, the processing comprising forming the source and drain regions and forming the gate stacks;

the method further comprising, prior to said processing:

by etching removing the sacrificial layer of each layer stack to form a respective cavity on either sides of the insulating wall underneath the channel layer of the first and second layer stack, the channel layers being supported by the insulating wall; and depositing a bottom insulating material in said cavities;

wherein, subsequent to said processing of the layer stacks to form the first and second transistor structures, the bottom insulating material forms a bottom insulating layer underneath the source region, the drain region and the channel region on either side of the insulating wall.

According to the inventive method, the sacrificial layers underneath the channel layers may be "replaced" by a bottom insulating layer for electrically insulating the semiconductor layer from the channel regions, and the source and drain regions of the first and second transistor structures.

Since this replacement process is performed prior to source/drain region and gate stack formation, the bottom insulating layers may extend uninterrupted underneath the source, drain, and channel regions. Moreover, the method is compatible with source/drain and gate stack formation processes conventionally used in advanced technology nodes, such as source/drain epitaxy and replacement metal gate (RMG) processes. A related advantage is that each one of the bottom insulating layers may extend uninterrupted underneath a plurality of pairs of first and second transistor structures formed along the insulating wall.

The replacement process is facilitated by the insulating wall which extends into the underlying semiconductor layer of the substrate. Thus, a height of the insulating wall (and correspondingly a depth of the trench) may exceed height of the layer stacks above (an upper surface of) the semiconductor layer of the substrate. A base portion of the insulating wall may thus be anchored in the underlying semiconductor layer. The insulating wall may hence act as a supporting structure for the remaining layers of the layer stacks (e.g. the channel layers) when the sacrificial layer is removed. The remaining layers may accordingly be suspended above the cavities by the insulating wall.

The insulating wall may additionally confer advantages corresponding to those of the forksheet device, e.g. provide physical and electrical isolation between the transistor structures and the respective gate stacks. More specifically, the insulating wall may simplify gate stack patterning and enable a reduced sensitivity to mask edge placement errors (EPE) since the gate stacks may be self-aligned with the respective channel regions of the transistor structures. For a complementary transistor pair, wherein the first device region may be an n-type device region and the second device region may be a p-type device region, this may offer further advantages during work function metal (WFM) fill and etch back in an RMG process. Furthermore, the insulating wall may reduce a risk of merging of the sources/drains of the transistor structures, e.g. during n- and n-type epitaxy.

The channel regions of the transistor structures extend in the first direction along the substrate. The first direction and second direction may be considered as "horizontal" directions (or synonymously "lateral" directions). The first and second (horizontal) directions are hence herein to be understood as respective directions/orientations along/parallel to a main plane of extension, or a main surface of, the substrate or the semiconductor layer of the substrate.

The term "bottom-up" or "vertical" may be used to refer to a direction/orientation normal to a main plane of extension, a main surface of, a substrate supporting the transistor structures. Meanwhile, terms such as "above", "upper", "top", "up" and "below", "lower", "bottom", "underneath", "down" may be used to refer to relative positions as viewed along the vertical direction, and does hence not imply an absolute orientation of the substrate.

The sacrificial and channel layers are layers of different semiconductor materials, wherein the sacrificial layers may be removed selectively to the channel layers. That is, the sacrificial layers may be removed selectively to the channel layers by etching the material of the sacrificial layers (the sacrificial material) selectively to material of the channel layers (the channel material). The sacrificial layers/material may hence be removed in an etching process preserving the channel layers/material. That is the selective removal of the sacrificial layers may comprise etching the sacrificial material at a greater rate than channel material.

The sacrificial layers as well as the channel layers may be epitaxial (e.g. epitaxially grown) semiconductor layers, e.g. of a sacrificial material and of a channel material, respectively. This enables high quality material layers with an advantageous degree of control of composition and dimensions.

The sacrificial layers and the channel layers may be Si-comprising layers, wherein the sacrificial layers have a greater Ge-content than the channel layers. The sacrificial layers and the channel layers may each be SiGe-layers. Alternatively, the sacrificial layers may be SiGe-layers and the channel layers may be formed of Si-layers. The sacrificial layers may be formed of $Si_{1-y}Ge_y$, and the channel layers may be formed of $Si_{1-z}Ge_z$, wherein y>z. A lower or zero Ge-content in the channel layers (i.e. y>z≥0) may facilitate selective processing, e.g. removal, of the sacrificial layers. A Ge-content of the sacrificial layers may advantageously be at least 20% greater than a Ge-content of the channel layers (i.e. y≥z+0.2).

Removing the sacrificial layer of each layer stack may comprise simultaneously etching the sacrificial layers of the layer stacks from a side (i.e. respective side of the layer stacks) facing away from the insulating wall.

The bottom insulating material may be conformally deposited over the layer stacks with a thickness such that said cavities are filled with the bottom insulating material, and subsequently the method may comprise removing the bottom insulating material from the layer stacks above a level of the cavities. The bottom insulating material may hence form a liner layer covering the layer stacks. A conformal deposition enables bottom insulating material to be deposited within the cavities. The deposition may be stopped when or after the cavities are closed or "pinched-off" by the bottom insulating material.

Subsequent to depositing the bottom insulating material, a second insulating material (e.g. an oxide such as silicon oxide) may be deposited. The second insulating material may cover the layer stacks and the bottom insulating material thereon. Thereafter, a simultaneous etch back of the second insulating material and the bottom insulating material in a top-down direction may be performed to expose the layer stacks above the level of the cavities. Upper portions of the layer stack (i.e. above the cavities) may hence be exposed from the bottom insulating material (e.g. the liner) and the second insulating material while the bottom insulating material is preserved in the cavities. The etched back second insulating material may remain as an insulating layer embedding lower portions of the layer stacks. The insulating layer may be preserved to form shallow trench insulation (STI) adjacent to the transistor structures.

The method may advantageously be used to form nanosheet transistor structures comprising a stack of nanosheet channel portions (e.g. "forksheet" FET structures). The method is however not limited to transistor structures comprising a stack of nanosheet channel portions but is generally applicable to form transistor structures, e.g. field-effect transistor (FET) structures, comprising one or more channel layer portions of e.g. a nanowire- or nanosheet-shape.

In a method for forming first and second transistor structures each comprising a plurality of channel layer portions, the sacrificial layers may be referred to as "first" sacrificial layers and each layer stack may comprise the first sacrificial layer, a plurality of channel layers and a plurality of "second" sacrificial layers. The "first" sacrificial layers may be referred to as "bottom" sacrificial layers and the "second" sacrificial layers may be referred to as "upper" sacrificial layers. The second sacrificial layers may alternate the channel layers. The channel layers may be formed of a different material (a channel material) than the first and second sacrificial layers. The method may comprise: removing the first sacrificial layer of each layer stack selectively to the second sacrificial layers and the channel layers. The subsequent processing of the layer stacks may (in addition to the source and drain formation and the gate stack formation) comprise forming released channel layer portions by etching the second sacrificial layers selectively to the channel layers. The gate stacks may be subsequently formed along the channel layer portions.

In other words, the first sacrificial layers may be removed in a first etching process such that the second sacrificial layers and the channel layers are preserved. Second sacrificial layer portions may be removed in a second etching process such that the channel layer portions are preserved.

The channel layer portions in the respective device regions may form the channel region of the respective transistor structures. The channel layer portions may be spaced apart by gaps or spaces, i.e. thus being "released".

Each gate stack may partially enclose the channel portions of the transistor structure. The gate stacks may be formed between (i.e. in the gaps) and along the released channel portions in the respective device regions. In other words, the channel layer portions may extend through the respective gate stacks.

Depending on a configuration of the layer stacks, each gate stack may be formed along at least two and in any case at most three sides of a channel layer portion. The presence of the insulating wall may block gate stack formation along sidewall surfaces of the channel portions facing the trench/insulating wall.

Different approaches for removing the first sacrificial layers selectively to the second sacrificial layers exist:

According to a first approach, the first sacrificial layers may be formed of a first sacrificial material. The second sacrificial layers may be formed of a second sacrificial material (different from the first sacrificial material). The channel layers may be formed of a channel material (different from the first and second sacrificial materials). Thereby the first sacrificial layers may be removed selectively to the second sacrificial layers and the channel layers by etching the first sacrificial material selectively to the second sacrificial material and the channel material. The first sacrificial layers/material may hence be removed in an etching process preserving the second sacrificial layers/ material and the channel layers/material. That is the selective removal of the first sacrificial layers may comprise etching the first sacrificial material at a greater rate than the second sacrificial material and the channel material. A selective etch of a material "A" (e.g. the first sacrificial material) with respect to a material "B" (e.g. the second sacrificial material) may by way of example be 10:1, or greater. That is, a removal rate of material "A" may be at least an order of magnitude greater than a removal rate of material "B".

In each layer stack, a bottom-most second sacrificial layer may be formed on the first sacrificial layer. Accordingly, each layer stack may comprise the first/bottom sacrificial layer and thereon a repetitive sequence of a second/upper sacrificial layer and a channel layer on the second/upper sacrificial layer. Hence, a gap or space may be formed also underneath the bottom-most channel layer portions in each device region, i.e. between the bottom insulating layers and the bottom-most channel layer portions. This configuration makes it possible for the gate stacks to be formed along three sides of also the bottom-most channel layer portions.

The first sacrificial material may be $Si_{1-x}Ge_x$, the second sacrificial material may be $Si_{1-y}Ge_y$, and the channel material may be $Si_{1-z}Ge_z$, wherein x>y>z. A higher Ge-content in the first sacrificial layers than the second sacrificial layers and the channel layers may facilitate selective processing, e.g. etching, of the first sacrificial layers. Correspondingly, higher Ge-content in the second sacrificial layers than the channel layers may facilitate selective processing, e.g. etching, of the second sacrificial layers. A Ge-content of the first sacrificial layers may advantageously be at least 20% greater than a Ge-content of the first sacrificial layers (i.e. x≥y+0.2). A Ge-content of the second sacrificial layers may advantageously be at least 20% greater than a Ge-content of the channel layers (i.e. y≥z+0.2). The channel layers may be Si-layers (i.e. z=0).

According to an alternative second approach, each first sacrificial layer may comprise a lower thickness portion and an upper thickness portion on which a bottom-most channel layer is formed. The method may further comprise: forming a spacer layer on sidewall surfaces of the first and second layer stacks facing away from the insulating wall, the spacer layer covering sidewall surfaces of the channel layers and of the second sacrificial layers, and exposing at least the lower thickness portion of the first sacrificial layers, and wherein the first sacrificial layers are removed selectively to the second sacrificial layers by etching the first sacrificial layers while using the spacer layer as an etch mask.

The first sacrificial layers may hence be removed in an etching process preserving the second sacrificial layers. That is the selective removal of the first sacrificial layers may comprise etching the first sacrificial material while masking the second sacrificial layers. Employing a spacer layer (e.g. a sidewall spacer layer) as an etch mask facilitates a selective removal of the first sacrificial layers even if the first and second sacrificial layers are formed of a same material (i.e. the first and second sacrificial material is the same material), if selective etching process for the materials of the first and second sacrificial layers is not available.

The lower thickness portion of each first sacrificial layer may have a greater width than the upper thickness portion such that an upper surface of the lower thickness portion is exposed adjacent to the upper thickness portion. Forming the spacer layer may comprise:

conformally depositing a spacer material over the first and second layer stacks; and etching back the deposited spacer material in a top-down direction such that the upper surface of the lower thickness portions is exposed and the spacer layer remains on the sidewall surfaces of the first and second layer stacks.

This may facilitate forming the spacer layer with a desired extension, i.e. masking (sidewall surface portions of) the channel layers and the second sacrificial layers and exposing at least a portion of the first sacrificial layers.

The first and second sacrificial layers may be formed of $Si_{1-y}Ge_y$, and the channel layers may be formed of $Si_{1-z}Ge_z$, wherein y>z. As discussed above, a higher Ge-content in the sacrificial layers than the channel layers may facilitate selective processing, e.g. etching, of the sacrificial layers.

According to the inventive method aspect, forming the layer stacks may comprise:

epitaxially growing layers of sacrificial material and layers of channel material, and patterning the epitaxially grown sacrificial and channel material layers to form the trench and the first and second layer stack.

The epitaxially grown layers may as discussed above be Si-comprising layers, wherein the sacrificial material(s) has a greater Ge-content than the channel material.

Each layer stack may be patterned to form an elongated (e.g. fin-shaped) layer stack extending along the first direction. The layer stacks may protrude above the semiconductor layer of the substrate (e.g. in a vertical direction).

Each layer stack may be patterned such that the channel layers form channel nanowires or channel nanosheets.

The method may comprise forming the trench and filling the trench the insulating wall material prior to forming the first and second layer stacks. Forming the trench and the layer stacks in sequence, may facilitate forming the trench to extend into the semiconductor layer of the substrate. Moreover, the insulating wall material may mask the trench while forming the layer stacks.

The processing of the layer stacks may further comprise:

forming a sacrificial gate extending across the layer stacks and the insulating wall;

etching the layer stacks on either side of the sacrificial gate;

forming the respective source and drain regions of the first and second transistor structures on either side of the sacrificial gate by epitaxy, wherein the source and drain regions are formed above the bottom insulating layer; and replacing the sacrificial gate by the gate stacks after forming the source and drain regions.

The gate stacks may hence be formed in an RMG-process. The sacrificial gate may act as a mask during the formation of the source and drain regions, e.g. comprising layer stack etching and epitaxy. The source/drain regions may thus be formed in a self-aligned manner with respect to the gate stacks/channel regions. wherein the insulating wall may act as a partition between the gate stacks of the first and second transistor structures. Moreover, the insulating wall may facilitate confining the source/drain epitaxy for the first transistor structure to the first device region, and the source/ drain epitaxy for the first transistor structure to the second device region.

The etching of the layer stacks may comprise etching back the layer stacks on each side of the sacrificial gate, stopping on the bottom insulating layer.

The method may further comprise, subsequent to said epitaxy, depositing a cover material covering the source and drain regions and surrounding the sacrificial gate; and removing the sacrificial gate to expose the first and second layer stack in a first and second gate trench, respectively, the first and second gate trenches being separated by the insulating wall;

wherein the gate stacks thereafter may be formed in the first and second gate trenches.

This facilitates forming gate stacks of different compositions for the first and second transistor structures.

The first transistor structure may e.g. be a p-type transistor structure and the second transistor structure may be an n-type transistor structure.

Forming the gate stacks may comprise: depositing a p-type effective work function metal, WFM, in the first and second gate trench, along the channel regions of the first and second nanosheet transistor structures;

forming a trench mask above the first gate trench removing the p-type WFM in the second gate trench by etching, while the trench mask and the insulating wall acts as an etch mask for the p-type WFM in the first gate trench; and subsequently depositing an n-type WFM in at least the second gate trench, along the channel region of the second nanosheet transistor structure.

The insulating wall facilitates a selective removal of the p-type WFM from the channel region of the second transistor structure, as the insulating wall may act as a lateral etch barrier counteracting lateral over-etching of the p-type WFM at the first channel portion. Furthermore, the insulating wall may physically and electrically separate the p-type WFM and n-type WFM. The n-type WFM may subsequently be deposited in at least the second gate trench, optionally also in the first gate trench on the p-type WFM.

Subsequent to removing the sacrificial gate and prior to forming the gate stacks, forming released channel layer portions by etching portions of the second sacrificial layers exposed in the first and second gate trenches, said etching being selective to the channel layers. Released channel layer portions may hence be formed in the gate trenches.

BRIEF DESCRIPTION OF THE DRAWINGS

The above, as well as additional objects, features and advantages of the present inventive concept, will be better understood through the following illustrative and non-limiting detailed description, with reference to the appended drawings. In the drawings like reference numerals will be used for like elements unless stated otherwise.

DETAILED DESCRIPTION

Figure 1:
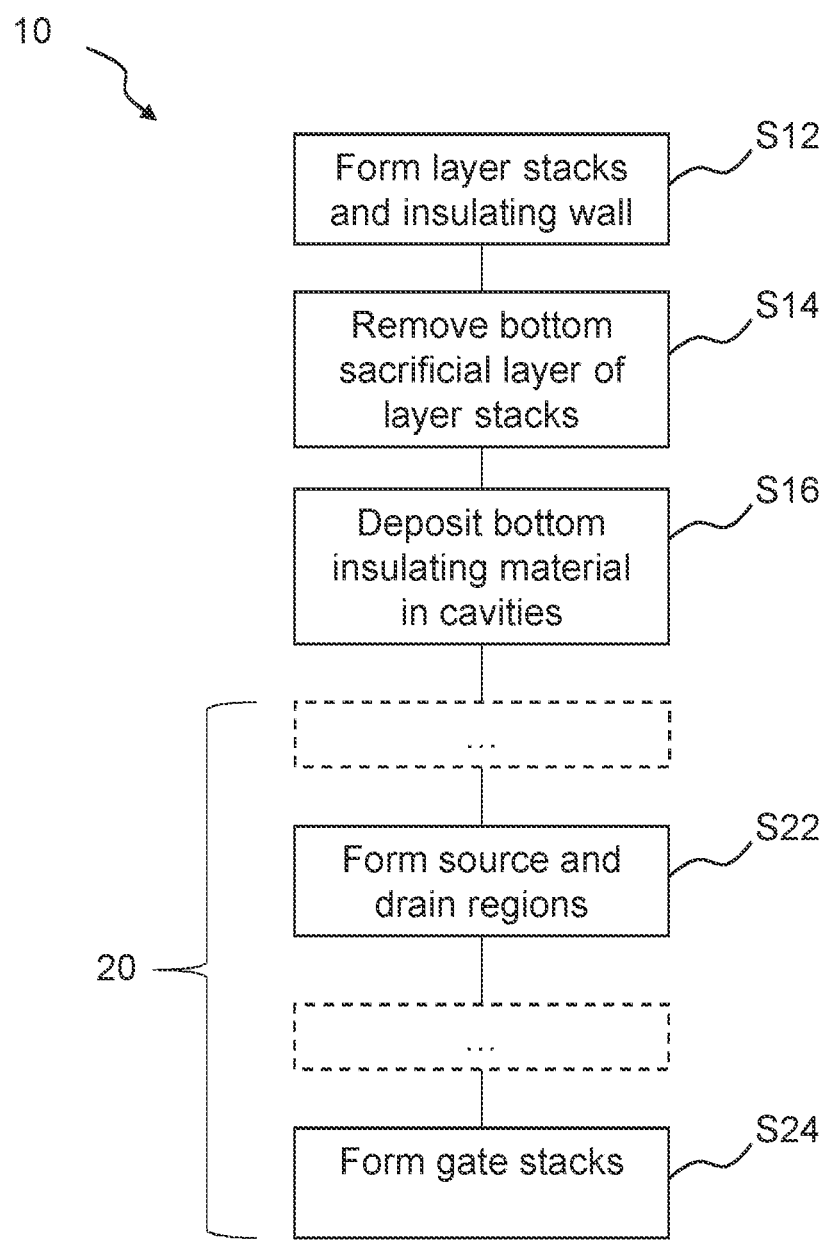
FIG. 1 is a flow chart of a method for forming a first and a second transistor structure.

FIG. 1 is a flow chart of a method 10 for forming a first and a second transistor structure, e.g. a first and second FET structure.

The method 10 comprises a step S12 comprising forming a first and a second semiconductor layer stack and an insulating wall. The layer stacks are on a semiconductor layer of a substrate. The first layer stack may be formed in a first device region of the substrate (e.g. a p-type device region) and the second layer stack may be formed in a second device region of the substrate (e.g. an n-type device region). The first and second layer stacks may have a same composition and comprise a bottom sacrificial layer and a channel layer above the bottom sacrificial layer. The layer stacks are spaced apart by a trench extending into the semiconductor layer substrate. The trench is filled with an insulating wall material to form the insulating wall.

The method 10 further comprises a step S14 comprising etching to remove the bottom sacrificial layers of each layer stack to form a respective cavity on either sides of the insulating wall underneath the channel layers. By the insulating wall, remaining layers of the layer stack may be supported above the cavities.

The method 10 further comprises a step S16 comprising depositing a bottom insulating material in the cavities formed on each side of the insulating wall in step S14. Accordingly, by steps S14 and S16 the bottom sacrificial layers may be replaced by a bottom insulating material, i.e. selectively to the channel layers. The bottom insulating material may form a bottom insulating layer on each side of the insulating wall. The bottom insulating layers may extend continuously underneath the source and drain regions and the channel region of the transistor structures which are to be formed on either side of the insulating wall. Different approaches for the selective replacement of the bottom sacrificial layers underneath channel layers will be disclosed in the below.

After forming the bottom insulating layers, the method may as indicated proceed with processing of the layer stacks to form the first and second transistor structures. In FIG. 1, the processing is indicated as a "processing block" 20 and may as shown comprise forming of source and drain regions for the first and second semiconductor structures (step S22), and forming gate stacks for the first and second transistor structures (step S24).

The processing block 20 may as indicated by the dashed boxes further comprise a number of additional processing steps, depending e.g. on the composition of the layer structures, the type of transistor structures which are to be formed, etc. For example, the processing block 20 may comprise sacrificial gate formation, channel layer portion release, replacement metal gate formation, and various masking and etching steps, as may be exemplified in the below.

The bottom sacrificial layers have a composition, i.e. are formed of a material, which is different from that of the channel layers. The bottom sacrificial layers may thus be removed selectively to the channel layers employing an etching process selective to the material of the sacrificial layers, i.e. etching the material of the bottom sacrificial layers at a greater rate than the material of the channel layers (and optional further layers of the layer stack). Any suitable dry etching process or wet etching process, or combination of a dry and a wet etching process, may be employed. The bottom sacrificial layer may according to an example be an epitaxial layer of a SiGe-alloy (e.g. with a Ge-content of 20-35%) and the channel layer may be an epitaxial layer of Si. The bottom sacrificial material may more generally be epitaxially grown $Si_{1-y}Ge_y$, and the channel material may be epitaxially grown $Si_{1-z}Ge_z$, wherein y>z≥0. By way of example, in a layer stack comprising a layer of $Si_{1-y}Ge_y$ and a layer of $Si_{1-z}Ge_z$ where y≥z+0.2, an HCl-based dry etch may provide an etch rate of the $Si_{1-y}Ge_y$ layer which exceeds an etch rate of the $Si_{1-z}Ge_z$ layer by at least an order of magnitude. Another example is an ammonia peroxide mixture (APM) wet etch. As may be appreciated, a greater difference in Ge-content may increase a relative etch rate of the bottom sacrificial material in relation to the channel material. Meanwhile, a greater difference may impact a material quality of the channel layers and suitable compositions may hence typically involve a trade-off between relative etch rates on the one hand and channel material quality on the other hand.

Although the method is suitable for layer stacks comprising a sacrificial layer with a greater Ge-content than the channel layer, the method is not limited thereto but an opposite relationship is also possible. More generally, it is contemplated that the method is applicable to any semiconductor layer stacks comprising sacrificial and channel layers of different compositions such that selective removal of the sacrificial layers is allowed.

The layer stacks may each comprise a bottom sacrificial layer and a single channel layer thereon, thus allowing forming of transistor structures comprising a single channel layer portion on a bottom insulating layer. Alternatively, the layer stacks may each comprise, above a bottom/first sacrificial layer, an alternating sequence of channel layers and upper/second sacrificial layers. Such a configuration allows forming of transistor structures having a respective channel region comprising a number of vertically distributed channel layer portions, the number corresponding to the number of channel layers in each layer stack. In this case, the removal of the bottom/first sacrificial layer of each layer stack may be selective to both the upper/second sacrificial layers and the channel layers, to allow selective replacement of the bottom sacrificial layers with the bottom insulating material. If the bottom sacrificial layer is formed of a material different from both the upper sacrificial layers and the channel layers, the bottom sacrificial layer may be removed selectively by etching. For example, the bottom sacrificial layers may be formed of $Si_{1-x}Ge_x$, the second sacrificial layers may be formed of $Si_{1-y}Ge_y$, and the channel layers may be formed of $Si_{1-z}Ge_z$ where x>y>z, e.g. x≥y+0.2 and y≥z+0.2. If the bottom and upper sacrificial layers are formed of a same material (e.g. $Si_{1-y}Ge_y$) but different from the channel layers (e.g. $Si_{1-z}Ge_z$, e.g. y≥z+0.2), the bottom sacrificial layer may be removed selectively by masking the upper sacrificial layers and the channel layers while etching. In either case, the processing block 20 may further comprise forming released channel layer portions by etching the second sacrificial layers selectively to the channel layers.

The layer stacks (e.g. comprising the bottom and upper sacrificial layers, and the channel layers) may as part of step S12 be formed by epitaxially growing layers of sacrificial material and layers of channel material. The layer of a (bottom/first) sacrificial material may first be grown on the semiconductor layer of the substrate. An alternating sequence of layers of channel material and (upper/second) sacrificial material may thereafter be sequentially grown. A chemical vapor deposition (CVD) process or any other conventional suitable deposition method may be used.

The substrate may be of a conventional type, such as a substrate suitable for complementary metal-oxide semiconductor (CMOS) processing and comprising (as a top-most layer) a semiconductor layer of a composition allowing forming of the layer stacks thereon. The substrate 100 may for instance be a semiconductor bulk substrate such as a Si substrate, a germanium (Ge) substrate or a silicon-germanium (SiGe) substrate. Other examples include a semiconductor-on-insulator (SOI) type of substrate such as a Si-on-insulator substrate, a Ge-on-insulator substrate or a SiGe-on-insulator substrate.

The epitaxially grown sacrificial and channel material layers may in step S12 further be patterned to form the trench (which is to be filled with the insulating wall material) and the first and second layer stacks. The patterning may comprise etching the epitaxially grown material layers while masking the same in regions where the layer stacks are to be formed. Either single- or multiple-patterning techniques may be employed, e.g. self-aligned double patterning (SADP), quadruple patterning (SAQP) or some other conventional self-aligned multiple patterning (SAMP) technique. The layer stacks may be patterned to form fin-shaped layer stacks, comprising e.g. channel layers in the form of channel nanosheets, i.e. nanosheet-shaped channel layers, thereby allowing forming of nanosheet-based transistor structures. A nanosheet may by way of example have a width (e.g. as seen across the length of the channel region) in a range from 10 nm to 30 nm and a thickness in a range from 3 nm to 10 nm. It is also possible to pattern the layer stacks such that the channel layers form nanowire-shaped layers. A nanowire may by way of example have a thickness similar to the example nanosheet however with a smaller width, such as 3 nm to 10 nm.

A method for forming nanosheet FET structures wherein a bottom insulating layer is formed according to a first approach, will now be disclosed with reference to FIGS. 2 to 12. The method is however not limited to transistor structures comprising a stack of nanosheet channel portions but is generally applicable to form transistor structures of a FET-type comprising one or more channel layer portions of e.g. a nanowire- or nanosheet-shape.

Figure 2:
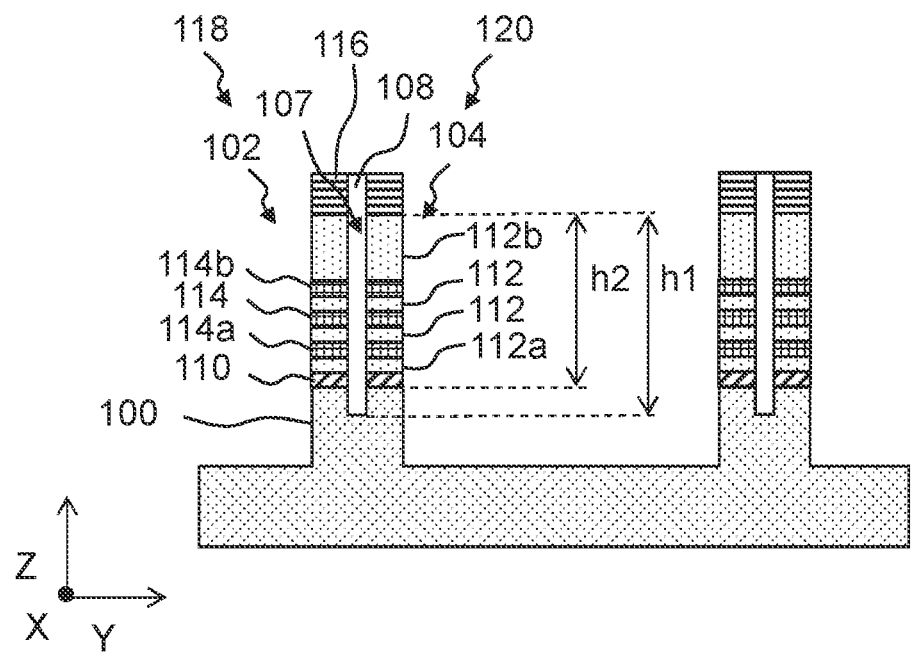
FIG. 2-12 illustrate method steps for forming nanosheet FET structures wherein a bottom insulating layer is formed according to a first approach.

FIG. 2 shows in cross-section a portion of a semiconductor layer of a substrate, commonly designated 100 in the figures and in the following for brevity referred to as "the substrate layer". In FIG. 2, directions X and Y indicates a first and a second horizontal direction, respectively (along the substrate layer 100). Direction Z indicates a vertical or bottom-up direction (normal to the substrate layer 100). The cross section is taken along the YZ-plane.

The method comprises forming a first and a second semiconductor layer stack 102, 104 on the substrate layer 100, the layer stacks 102, 104 being spaced apart along the Y-direction by a trench 107 filled with an insulating material to form an insulating wall 108 (e.g. step S12 of method 10 of FIG. 1). The trench 107 may be formed to extend along an intended boundary between a first device region 118 and a second device region 120. The first and second device regions 118, 120 may be regions in which p- and n-type devices, respectively, are to be formed. Hence, the position of the trench 107 may determine a position of a PN boundary between the first and second transistor structures, to be formed. The trench 107 may for example be formed with a width in a range from 5 nm to 20 nm.

The following description will refer to processing of one pair of layer stacks 102, 104. However as indicated in figures, a number of such pairs may be formed on the substrate layer 100 and processed in parallel. As may be appreciated, the substrate layer 100 may typically present a much greater lateral/horizontal extension than shown, beyond the illustrated section. It may further be noted that the relative dimensions of the shown structures, for instance the relative thickness of layers, is merely schematic and may, for the purpose of illustrational clarity, differ from a physical device structure.

The layer stacks 102, 104 may be formed as fin-shaped structures, elongated in the X-direction. Each layer stack 102, 104 may as shown comprise, in a bottom-up direction, a bottom/first sacrificial layer 110, and an alternating sequence of upper/second sacrificial layers 112 and channel layers 114. The number of upper sacrificial layers 112 and channel layers 114 shown in FIG. 2 is merely an example and a greater or smaller number of upper sacrificial layers 112 and channel layers 114 may be varied. A same reference sign is for used to designate the sacrificial layers 110, 112 and channel layers 114 in the first and second layer stacks 102, 104. It should however be understood that each layer stack 102, 104 may comprise respective sacrificial layers 114, and channel layers 116, on either side of the insulating wall 108.

As indicated in FIG. 2, the bottom sacrificial layer 110, the upper sacrificial layers 112 and the channel layers 114 may form nanosheets. A top-most upper sacrificial layer 112b may as shown optionally be formed with a greater thickness in order to extend a height of the insulating wall 112b above the top-most channel layer 114b. The following description is however more generally applicable also to other layer stack configurations, such as layer stacks comprising sacrificial layers of a greater thickness than the channel layers formed as nanosheets (enabling an increased vertical spacing of the channel layers), and layer stacks comprising sacrificial layers and channel layers formed as nanowires (enabling forming of nanowire transistor structures). As a further example, a thickness of the bottom sacrificial layer 110 may generally be adapted to correspond to a desired thickness of the bottom insulating layer, which is to be formed.

The bottom-most second sacrificial layer 112a may be formed on (i.e. in abutment with) the bottom sacrificial layer 110. This enables forming of a gate stack extending also underneath a channel layer portion of the bottom-most channel layer 114a. If such a gate stack configuration is not desired, it is however also possible to form the bottom-most channel layer 114 on the bottom sacrificial layer 110. As further shown in figure, the top-most channel layer 114b each layer stack 102, 104 is formed underneath a top-most sacrificial layer 112b. This enables forming of a gate stack extending also above a channel layer portion of the top-most channel layer 114b. If such a gate stack configuration is not desired, it is however also possible to omit a sacrificial layer on the top-most channel layer 114b.

The bottom sacrificial layer 110 may be formed of a first sacrificial material, the upper sacrificial layers 112 may be formed of a second sacrificial material and the channel layers may be formed of a channel material. Any one of the above discussed examples of materials are possible, e.g. the first sacrificial material may be $Si_{0.35}Ge_{0.65}$, the second sacrificial material may be $Si_{0.65}Ge_{0.35}$ and the channel material may be Si.

The layer stacks 102, 104 and the trench 107 may as discussed above be formed by patterning an epitaxially grown material layer stack. Various options for forming the layer stacks 102, 104 and the trench 107 are possible: The trench 107 may be patterned in the material layer stack using a first set of etch masks, and then filled with the insulating wall material to form the insulating wall 108 therein. The layer stacks 102, 104 may subsequently be patterned on either side of the insulating wall using a second set of etch masks. Alternatively, the preliminary layer stack may first be patterned in the material layer stack employing a first set of etch masks. The trench 107 may subsequently be patterned in the preliminary layer stack using a second set of etch masks to divide the same into the first and second layer stacks 102, 104. The trench may thereafter be filled with the insulating wall material to form the insulating wall 108 therein. Reference sign 116 indicate portions of an etch mask (e.g. of an oxide, nitride or carbide-based material) remaining on the layer stacks 102, 104 after the patterning.

In either case, the insulating wall material may be conformally deposited before being etched isotropically or anisotropically (i.e. in a top-down direction) to remove the deposited insulating material outside the trench 107. The insulating wall material may be deposited with a thickness such that the insulating wall material deposited at the respective sidewalls of the trench 107 join to "close" and thus fill the trench 107. By the etching the insulating material may be removed outside of the trench 107, but preserved in the "closed" trench 107. As may be appreciated, the insulating wall material filling the trench 107 may be subjected to an etch back (top-down) by an amount corresponding to the thickness of the conformally deposited insulating material outside of the trench 107 (provided the isotropic etching is stopped when the insulating material has been removed outside of the trench 107). The insulating wall material may for instance be a nitride- or oxide-comprising material, advantageously of a high-k, such as SiN, SiCO, SiCN or SiOCN deposited e.g. by ALD or CVD.

The trench 107 may as shown in FIG. 2 be formed to extend in to the substrate layer 110. The trench 107 may hence be formed with a depth h1 exceeding a height h2 the layer stacks 102, 104 above the substrate layer 110. A base portion of the insulating wall 108 may hence be embedded in the substrate layer 110. This may confer structural stability mitigating a risk of collapse of the layer stacks 102, 104 when the bottom sacrificial layers 110 is removed, as discussed below.

Figure 3:
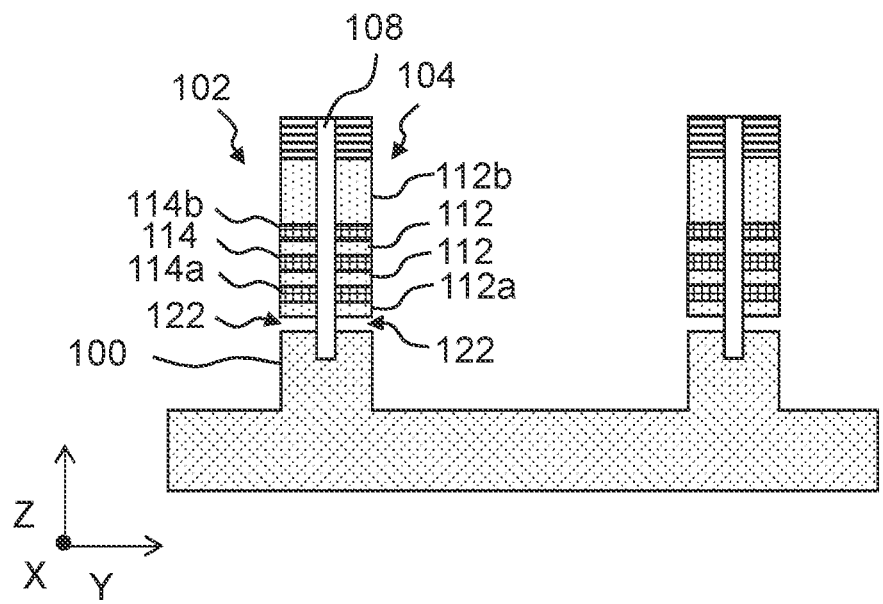

In FIG. 3 the bottom sacrificial layer 110 of each layer stack 102, 104 has been removed by etching (e.g. step S14 of method 10 of FIG. 1). A respective cavity 122 has thereby been formed on either sides of the insulating wall 108, underneath the bottom-most channel layer 114a of the layer stacks 102, 104. As the first sacrificial material (i.e. the material of the bottom sacrificial layers 110) is different from the second sacrificial material and the channel material, the bottom sacrificial layer 110 may be removed by a selective etching process. As shown, the removal of the bottom sacrificial layer 110 of each layer stack 102, 104 may comprise simultaneously etching the sacrificial layers 110 of the layer stacks 102, 104 from a respective side of the layer stacks 102, 104 facing away from the insulating wall 108.

Figure 4:
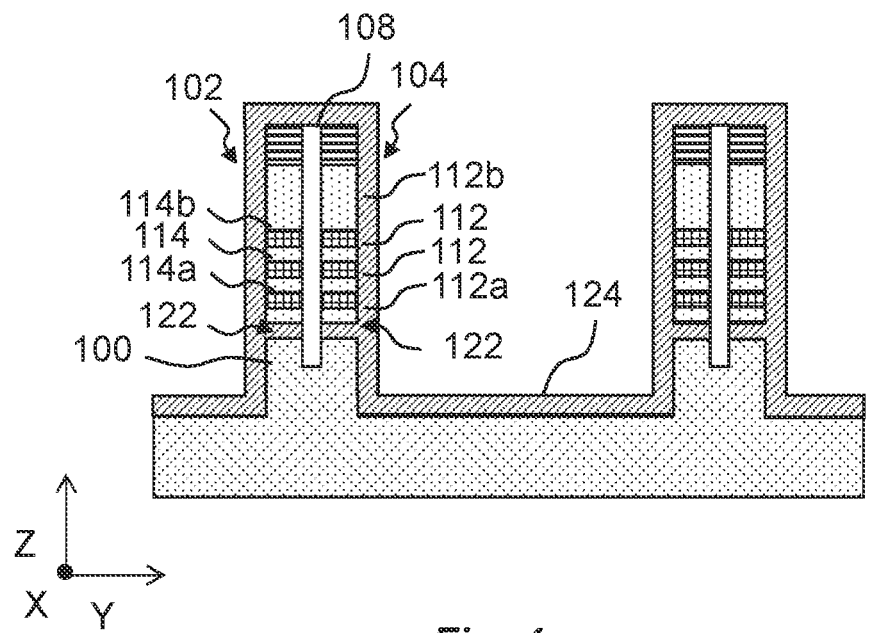

In FIG. 4 a bottom insulating material 124 is deposited in the cavities 122 (e.g. step S16 of method 10 of FIG. 1). The bottom insulating material may as shown be conformally deposited over the layer stacks 102, 104 with a thickness such that the cavities 122 are filled with the bottom insulating material. The bottom insulating material 124 may for example be selected among the examples mentioned for the insulating wall material.

Figure 5:
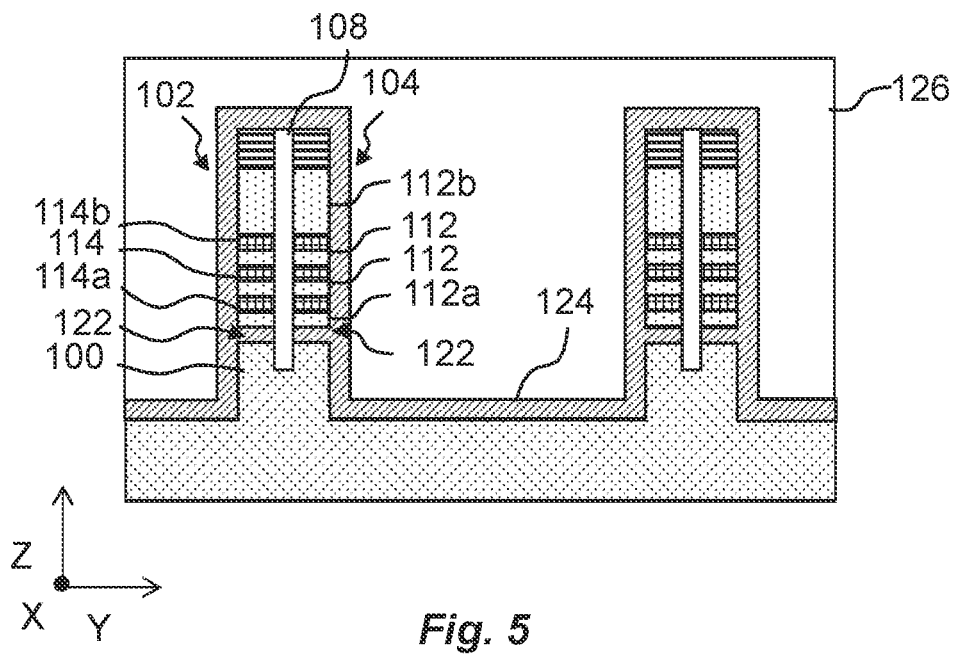
Figure 6:
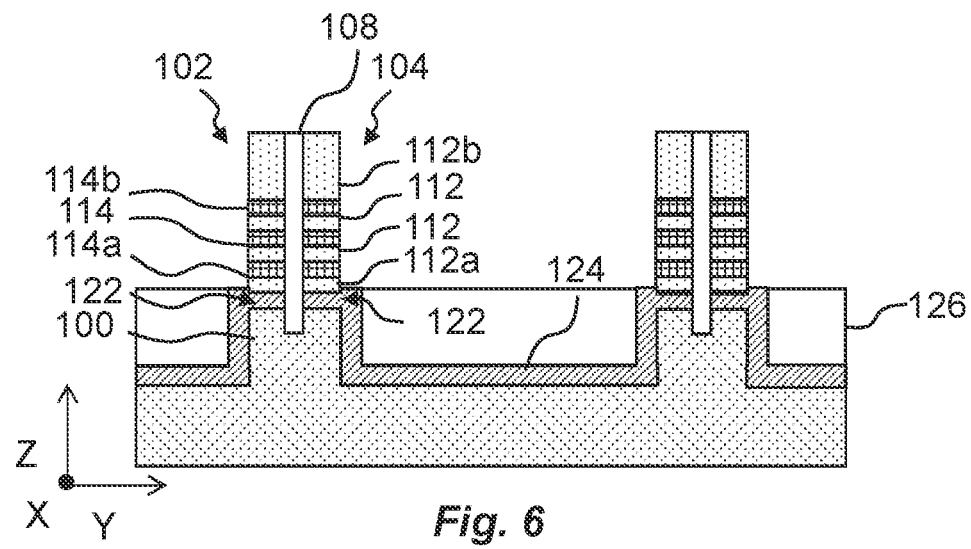

FIGS. 5 and 6 shows how the bottom insulating material 124 subsequently may be removed from the layer stacks 102, 104 above a level of the cavities 122.

In FIG. 5, a second insulating material 126 has been deposited to cover the layer stacks 102, 104 and the bottom insulating material 124 thereon. The second insulating material 126 may be an oxide, such as silicon oxide deposited e.g. by CVD, for example by flowable CVD (FCVD).

In FIG. 6, the second insulating material and the bottom insulating material 124 have simultaneously been etched back in a top-down direction to expose the layer stacks 102, 104 above the level of the cavities 122. For example, a wet etching process may be employed to etch the second insulating material (e.g. silicon oxide) and the bottom insulating material 124 (e.g. SiN). Preceding the etch back, chemical mechanical polishing (CMP) may be applied to provide the second insulating material 126 with a planar upper surface and perform an initial thickness reduction thereof. The CMP may proceed to remove also remaining mask portions (e.g. mask portions 116 shown in FIG. 2) from the layer stacks 102, 104. The CMP may for example be stopped on the top-most sacrificial layer 112b.

As shown in FIG. 6, bottom insulating material 124 remain in the cavities 122 following the etch back and may thus form bottom insulating layers. In FIG. 6 the etch back has been stopped slightly above a level of the recesses 122, coinciding with a level of the bottom-most sacrificial layer 112a. This however merely represents an example and it is also possible to proceed further with the etch back, e.g. to a level falling within the cavities 122, as the layers of the layer stacks 102, 104 remaining above the cavities 122 may shadow the bottom insulating material 124 deposited in the cavities 122. The (etched back) second insulating material 126 may form part of a shallow trench insulation (STI) regions between pairs of first and second FET structures.

The method may thereafter proceed with processing of the layer stacks 102, 104 to form the first and second nanosheet transistor structures (e.g. processing block 20 of method 10 of FIG. 1).

Figure 7:
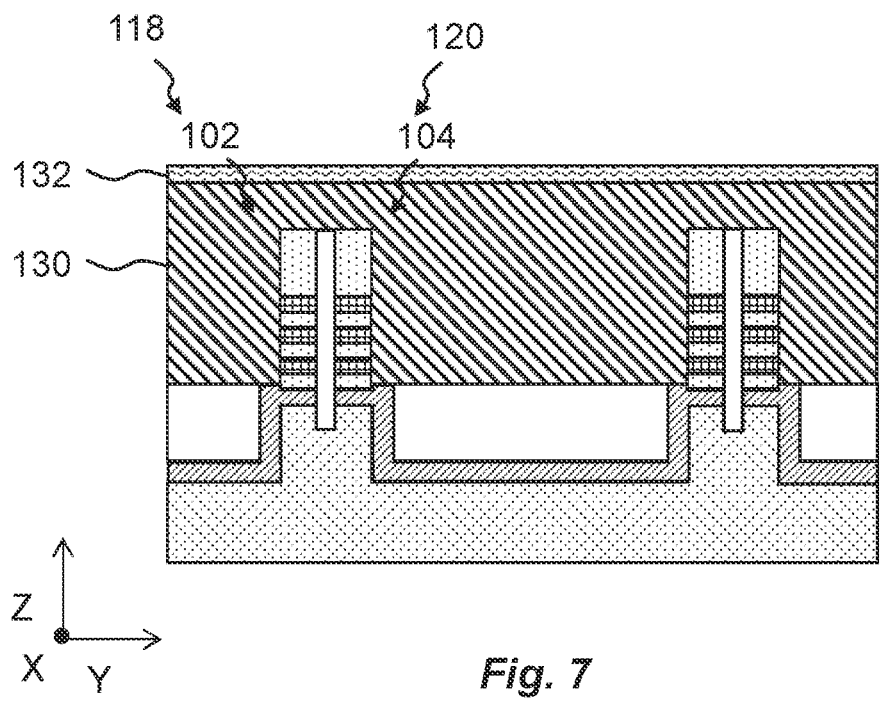
Figure 8:
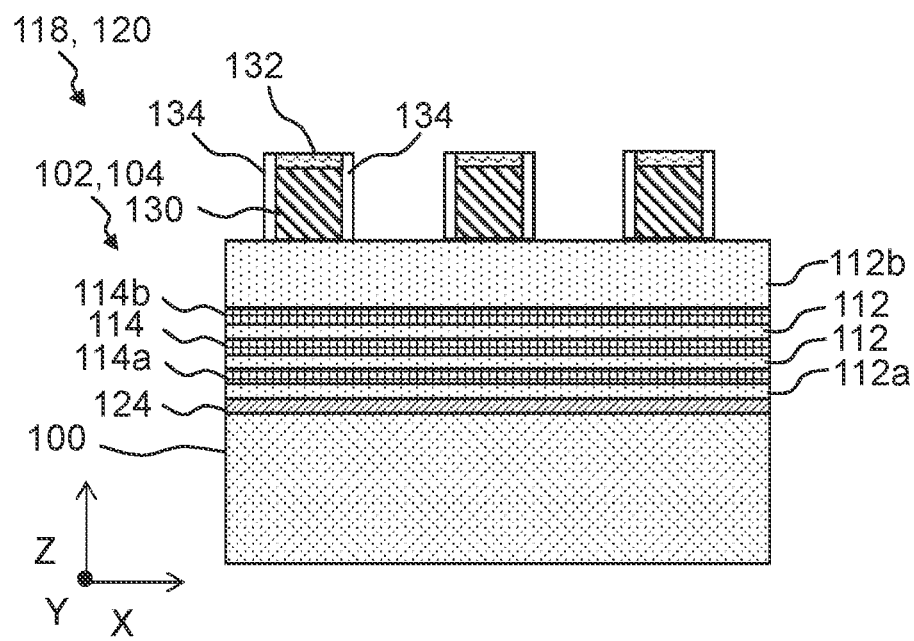

In FIG. 7, a sacrificial gate 130 (also known as a dummy gate) has been formed to extend across the layer stacks 102, 104 and the insulating wall 108. The sacrificial gate 130 may thus extend uninterrupted between the first and second device regions 118, 120. A number of sacrificial gates 130 may be formed to extend in parallel across the layer stacks 102, 104, as shown in the further cross-sectional view of FIG. 8, taken along the XZ plane. FIG. 8 may only show a cross-section through one of the layer stacks 102, 104. Since the layer stacks 102, 104 are identical, FIG. 8 may however be considered to represent a view of any one of the layer stacks 102, 104 and device regions 118, 120.

The sacrificial gates 130 may be formed in a manner which per se is known in the art, i.e. by patterning a layer of e.g. amorphous Si (e.g. using SADP or SAQP). Portions of the mask (e.g. of hard mask material) used for the patterning may remain on the sacrificial gates 130 as gate caps 132. As further shown in FIG. 7, gate spacers 134 may be formed along the sidewalls of the sacrificial gates 130, e.g. by a conformal gate spacer layer deposition (e.g. SiC or SiBCN deposited by ALD) followed by a (top-down) anisotropic etch.

The sacrificial gate 130 (or the sacrificial gate structure comprising the sacrificial gate 130, the gate cap 132, and the gate spacers 134) defines, by its overlap with the first and second layer stacks 102, 104, a location of a respective channel region of the first and second transistor structures to be formed. Locations of respective source and drain regions are correspondingly defined on either side of the respective channel regions (i.e. regions not covered by the sacrificial gate 130/sacrificial gate structure).

Figure 9:
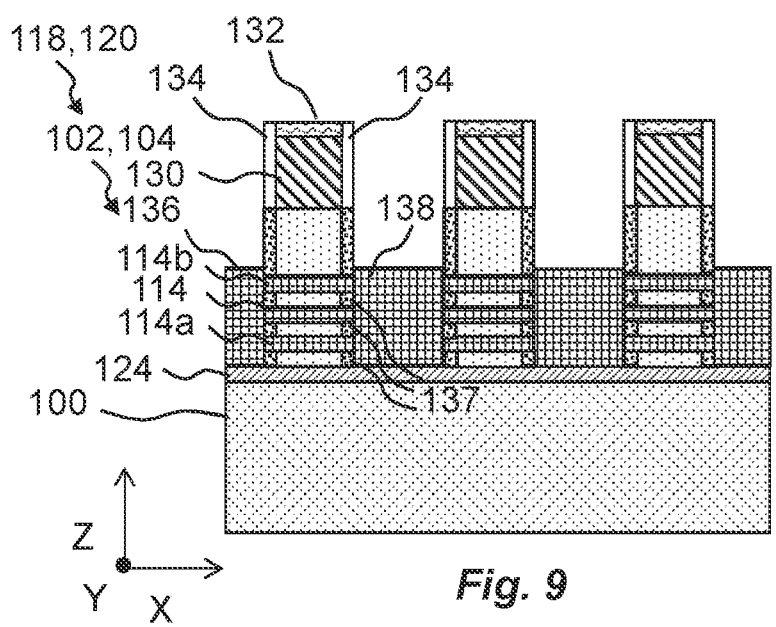

In FIG. 9, the layer stacks 102, 104 have been etched back on either sides of the sacrificial gate 130, thereby forming "cut" or "recessed" regions. Subsequently, respective source and drain regions 136, 138 have been epitaxially grown on either side of the sacrificial gate 130, i.e. in the recessed regions.

During the etch back, the sacrificial gate structure 130, 132, 134 may act as an etch mask. The etch back may as shown proceed until the upper surfaces have been recessed to a level of the bottom insulating layer 124 and then stopped. Thereby both the channel material and the second sacrificial material may be removed prior to forming the source and drain regions 136, 138. A dry etch such as RIE may be used to anisotropically etch back the first and second stacks 112, 114 in the recessed regions where the source/drain regions 136, 138 are to be formed. The dry etch may be adapted to anisotropically etch back the first and second stacks 112, 114 in a top-down direction such that undercutting the sacrificial gate 122 is avoided or at least minimized.

The source and drain regions 136, 138 may be thus formed above the bottom insulating layer 124. Each source region 136 and drain region 138 may form an epitaxially grown semiconductor body. The source/drain 130 may be grown on exposed end surfaces/sidewall surfaces of the channel layers 114, exposed during the etch back. As may be appreciated, the choice of semiconductor material may take the channel material into account. For instance, Si selective area epitaxy may be performed on Si channel layers. The source and drain regions 136, 138 may be doped in accordance with the desired conductivity type, for instance through in-situ doping. However, implantation doping or diffusion doping may also be employed. As an example, the source and drain regions 136, 138 in the first device region 118 may be doped with a p-type dopant (to form a p-type nanosheet transistor structure). The source and drain regions 136, 138 in the second device region 120 may be doped with an n-type dopant (to form an n-type nanosheet transistor structure). The n-doped regions and the p-doped regions may be formed sequentially, such that the n-epitaxy is performed while the p-doped region is masked, and vice versa. Advantageously, the insulating wall 120 may facilitate separation between the n- and p-type source/drain regions.

As further shown in the figures, the method may further comprise a step of forming so-called "inner spacers" 137. The inner spacers may cover end surfaces 137 of the upper sacrificial layers 112 facing the recessed regions. Inner spacers 137 may be formed subsequent to forming the recessed regions and prior to forming the source and drain regions 136, 138. Inner spacers may be formed in a manner which per se is known in the art of NWFETs/NSHFETs. For example, inner spacer cavity formation may proceed by a selective lateral (horizontal) etch back of end surfaces of the upper sacrificial layers 112 relative to the channel layers 114; a conformal spacer material deposition (e.g. SiN, SiCO or some other suitable low-k ALD-dielectric); followed by etching of the spacer material such that spacer material remains only in inner spacer cavities to form the inner spacers.

Figure 10:
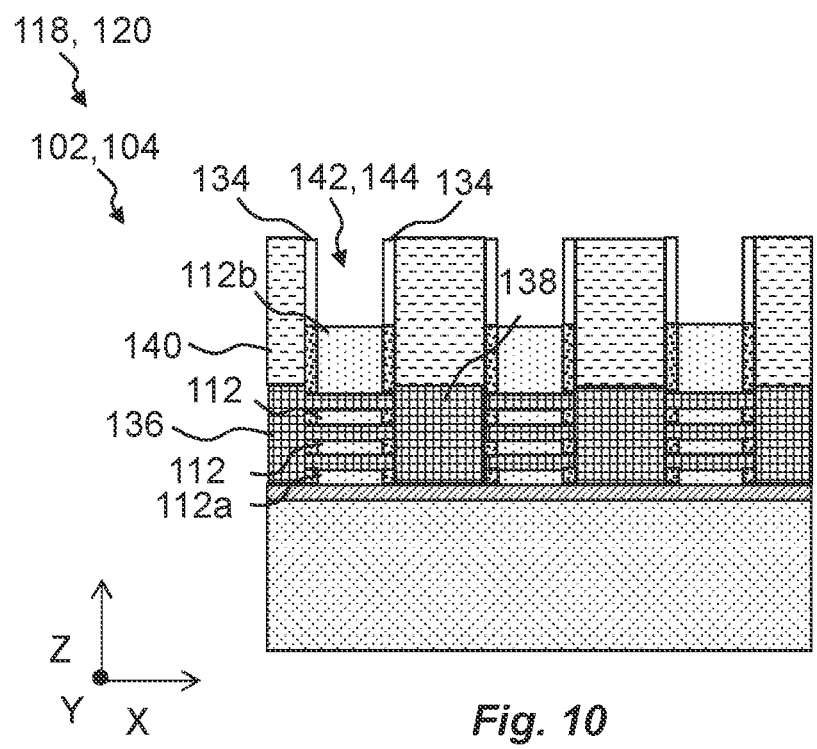
Figure 11:
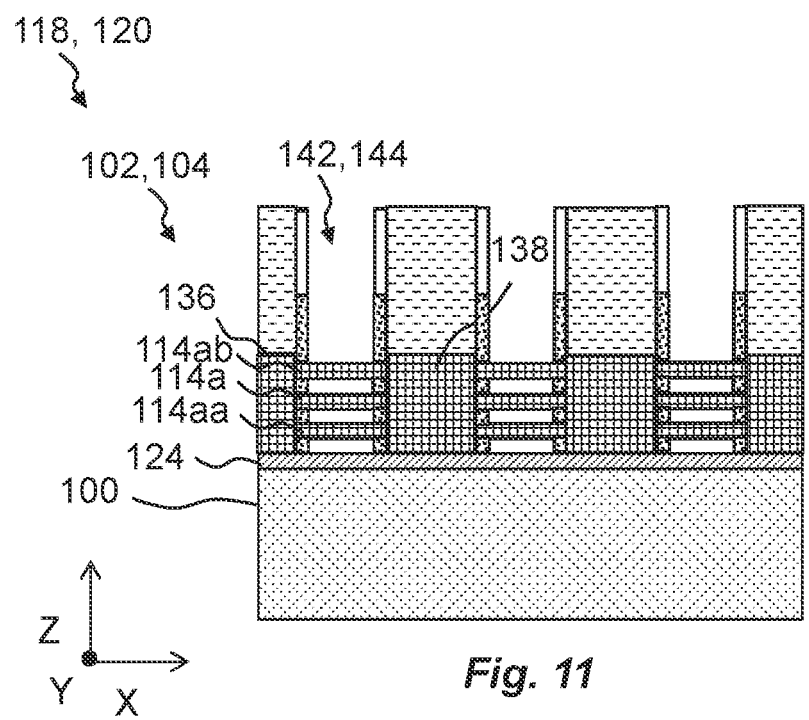
Figure 12:
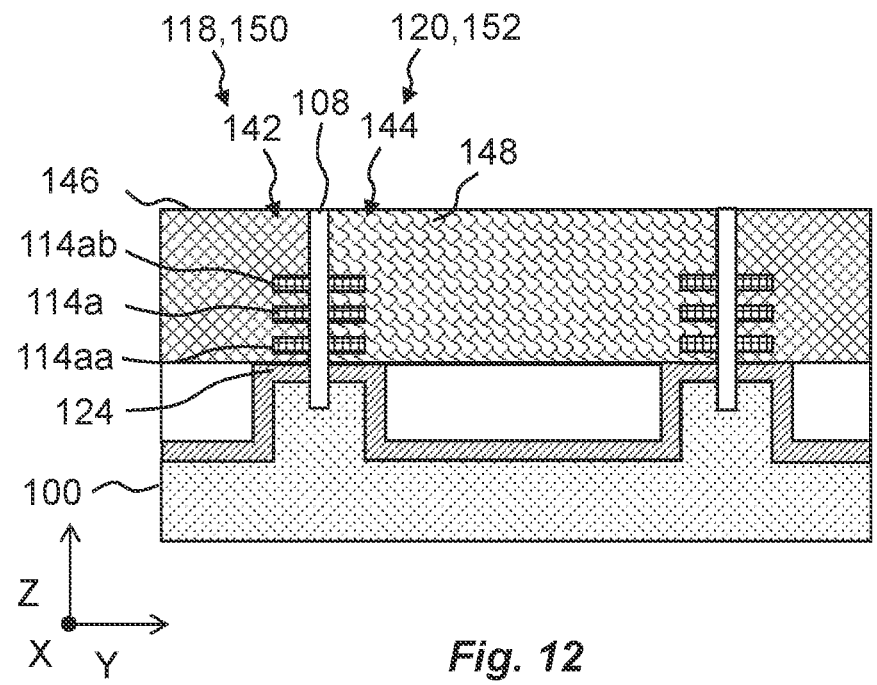

FIG. 10-12 show subsequent process steps for replacing the sacrificial gate 130 with a replacement metal gate stack 146, 148, and additionally process steps for forming "released" channel portions.

In FIG. 10, a cover material has been deposited to cover the source and drain regions 136, 138 and surround the sacrificial gate 130.

The cover material 140 may be an insulating material, such as an oxide, e.g. silicon oxide, or another gap fill dielectric material, deposited, planarized and recessed, e.g. by CMP and/or etch back. The CMP and/or etch back may proceed to also remove the gate cap 132, thus revealing an upper surface of the sacrificial gate 130. The sacrificial gate 122 may thereafter be removed to expose the first layer stack 102 in a first gate trench 142 in the first region 118, and the second layer stack 104 in a corresponding second gate trench 144 in the second region 120. The gate spacers 134 may as shown be preserved in this process. As may be understood, the first gate trench 142 and the second gate trench 144 will be separated by the insulating wall 108.

In FIG. 11 portions of the upper sacrificial layers 112 have been removed in the first gate trench 142 and the second gate trench 144 by etching. FIG. 11 shows the resulting "released" channel layer portions commonly referenced 114a, e.g. each having a shape of a nanosheet. The channel layer portions 114a comprise a bottom-most channel layer portion 114aa and a top-most channel layer portion 114ab. As shown, upper and lower surfaces of the channel portions 114a may be exposed within the first and second gate trenches 142, 144 and the second gate trench. The channel layer portions 114a form part of the respective channel regions of the first and second transistor structures. The channel region comprising the channel layer portions 114a extend between the source and drain regions 136, 138, along the X-direction. As the second sacrificial material (i.e. the material of the upper sacrificial layers 112) is different from the channel material, the upper sacrificial layers 112 may be removed by a selective etching process. For example, an HCl-based dry etch may be used. However, other appropriate etching processes (e.g. wet etching processes) allowing selective etching of SiGe with respect to Si as per se known in the art and may also be employed for this purpose.

As may be seen from the figure, the channel portions 114a are "partly released" in the sense that their upper and lower surfaces as well as outer sidewall surfaces are laid bare while their inner sidewall surfaces (i.e. facing the insulating wall 108) are not laid bare but abut (and hence are covered by) the insulating wall 108.

FIG. 12 shows a same cross-section as FIG. 2, i.e. along the YZ plane and extending through the first and second gate trenches 142, 144. As shown in FIG. 12 a first FET structure 150 is formed in the first device region 118 and a second FET structure 152 is formed in the second device region 120. Gate stacks 146, 148 (comprising replacement metal gates) of the first and second FET structures 150, 152 have been formed in the first and second gate trenches 142, 144, respectively. The gate stacks 146, 148 have a fork-like shape, with a number of prongs extending along and between the channel layer portions 114a.

Although shown as a single structure, each gate stack 142, 144 may have a composite structure comprising a gate dielectric layer (such as a high-k dielectric e.g. $HfO_2$, HfSiO, LaO, AlO or ZrO) on the channel portions 114a, one or more effective work function metal (WFM) layers on the gate dielectric layer (e.g. an n-type WFM such as TiAl or TiAlC in the second device region 120/second gate trench 144, and a p-type WFM such as TiN or TaN covered by the n-type WFM in the first device region 118/first gate trench 142), and optionally a gate fill metal (such as W, Al, Co or Ru). The WFM layers may be conformally deposited e.g. by ALD. The gate fill metal may for instance be deposited by CVD or PVD.

In more detail, forming the gate stacks may comprise depositing the gate dielectric layer in the first and second gate trenches 142, 144. Subsequently, the p-type WFM (or n-type WFM) may be deposited in the first and second gate trenches 142, 144. The deposition of the p-type (or n-type) WFM may be followed by an etch-back in a top-down direction, in which the p-type (or n-type) WFM is recessed to a level below, at or slightly above an upper surface of the insulating wall 108. A mask layer may be deposited, such as SoC or other organic spin-on, and etched back for instance by dry etching to a target level. The etched back mask layer may then be used as a mask while p-type (or n-type) WFM on surfaces above the target level (such as surfaces outside of the gate trenches 142, 144) is removed by for example isotropic etching, e.g. a wet metal etch.

A trench mask may subsequently be formed above the first (or second) gate trench 142 wherein the p-type (or n-type) WFM may be removed from the second (or first) gate trench 144 by etching, while the trench mask and the insulating wall 108 acts as an etch mask for the p-type (or n-type) WFM in the first (or second) gate trench 142.

Subsequently an n-type (or p-type) WFM may be deposited in at least the second (or first) gate trench 144, optionally both the first and the second gate trench 142, 144.

The gate fill metal may subsequently be deposited to fill a remaining space in the first and second gate trenches 142, 144. The gate fill metal may be etched back (top-down) to obtain final gate stacks 146, 148 of a desired height. In FIG. 12, the etch back has been performed such that the gate stacks 146 and 148 form electrically disconnected gate stacks, separated by the insulating wall 108. It is however also possible to limit the etch back such that the gate stacks 146, 148 remain connected across the insulating wall 108. The gate stacks 146, 148 may thus designate electrically connected parts of a common gate stack. This may be suitable configuration for e.g. a CMOS inverter.

The method may proceed with contact formation (for the gate stacks 146, 148 and the source/drain regions 136, 138) and routing layer formation, as per se is known in the art, to incorporate the transistor structures into a functioning circuit.

A method for forming nanosheet FET structures wherein a bottom insulating layer is formed according to a second approach, will now be disclosed with reference to FIGS. 13 to 17. Similar to the first approach described above, the second approach is disclosed with reference to nanosheet FET structures but is generally applicable to form transistor structures of a FET-type comprising one or more channel layer portions of e.g. a nanowire- or nanosheet-shape.

The second approach proceeds in a similar manner as the first approach, however differs in that it obviates the need for a bottom sacrificial layer of a different material than the upper sacrificial layers. In other words, a same material may be used for the bottom sacrificial layer and the upper sacrificial layers.

Figure 13:
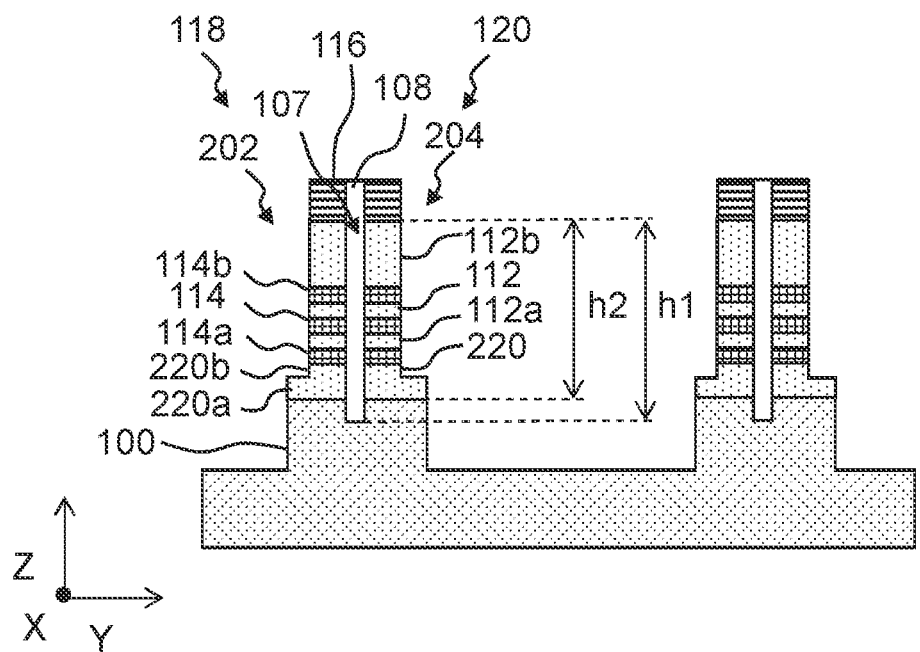
FIG. 13-17 illustrate method steps for forming a bottom insulating layer according to a second approach.

FIG. 13 illustrates similar to FIG. 2 a first and a second semiconductor layer stack 202, 204 which are similar to layer stacks 102, 104 but differ in the absence of the bottom sacrificial layer 110 of the first sacrificial material. Instead the bottom sacrificial layer 220 is formed by a same sacrificial material as the upper sacrificial layers 112. The sacrificial layers 112, including the bottom sacrificial layer 220, may be formed of a sacrificial material and the channel layers 114 may be formed of a channel material. The example materials discussed in connection with the method of FIG. 1 of materials may be used, e.g. the sacrificial material may be $Si_{0.65}Ge_{0.35}$ and the channel material may be Si.

The bottom sacrificial layers 220 comprises a lower thickness portion 220a and an upper thickness portion 220b on which a bottom-most channel layer 114a is formed.

The lower thickness portion 220a has a greater width (i.e. along the Y-direction) than the upper thickness portion 220b. An upper surface of the lower thickness portion 220a is thus exposed adjacent to the upper thickness portion 220b, and in other words protrudes laterally outside the upper thickness portion 220b. This profile may of the bottom sacrificial layers 220 may for example be obtained as follows. Layers of sacrificial material and channel material may be alternatingly epitaxially grown to form a material layer stack on the substrate layer 100. The bottom-most sacrificial material layer may be formed with a greater thickness than subsequently grown channel material layers and sacrificial material layers. The material layer stack may then be patterned to form "preliminary" layer stacks 202, 204 using a first etch mask (e.g. mask portions 116 in FIG. 13), comprising etching the material layer stack and stopping at a level within the bottom-most sacrificial layer. Thereby, the dimensions of the upper portion 220b and higher-level layers of the layer stacks 202, 204 may be defined. Thereafter, the preliminary layer stacks 202, 204 may be covered by a second etch mask with a width (along the Y-direction) exceeding a width of the preliminary layer stacks 102, 104. The second etch mask e.g. be formed by SoC patterned using lithography and etching. Further patterning of the bottom-most sacrificial layer may then be performed using the second etch mask. The etching may be stopped on the substrate layer 100, or as shown in FIG. 13, be extended into the substrate layer 100. By the further patterning, the (wider) dimensions of the lower portion 220a of the bottom sacrificial layer 220 may be defined. The second etch mask may thereafter be removed. The trench 107 may as discussed in connection with the first approach be formed and filled with insulating wall material either prior to or after initiating forming of the layer stacks 202, 204.

Figure 14:
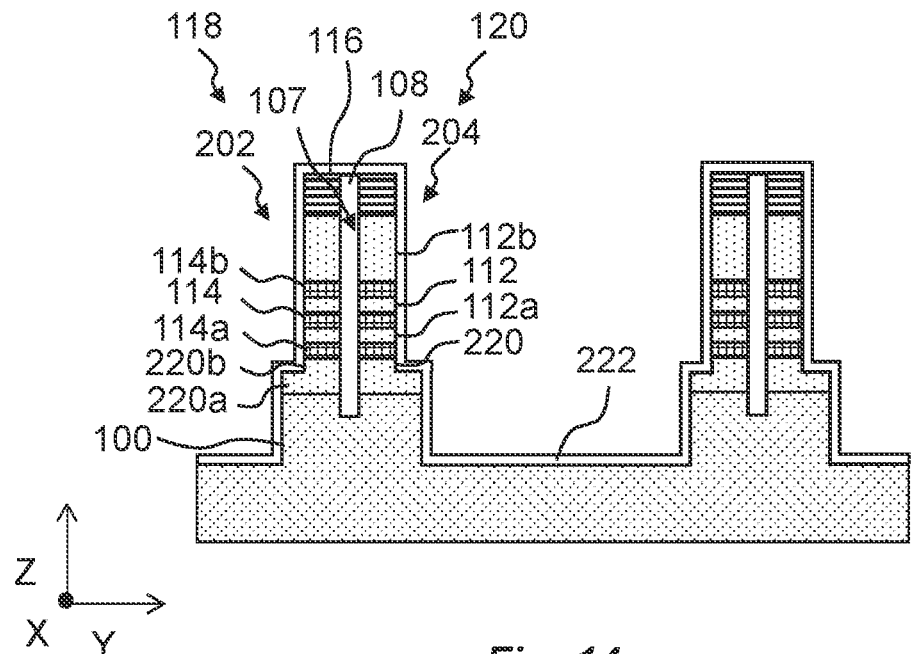
Figure 15:
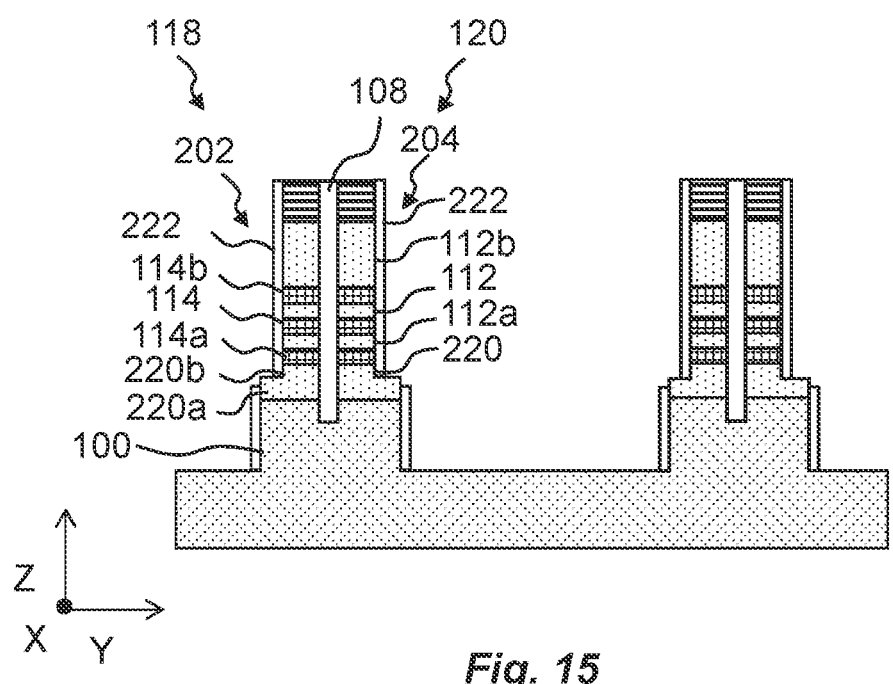

FIGS. 14 to 15 illustrate forming of a spacer layer 222 covering "outer" sidewall surfaces of the first and second layer stacks 202, 204 facing away from the insulating wall 108 and exposing horizontally oriented surfaces thereof, including the upper surface of the lower thickness portions 220a of the bottom sacrificial layer 220. Forming the spacer layer may comprise conformally depositing a spacer material over the first and second layer stacks 202, 204. The spacer material may be an oxide-, a nitride- or a carbide-based material, such as $SiO_2$, SiN, SiCO, SiCN or SiOCN deposited e.g. by ALD. The spacer material may thereafter be anisotropically etched (top-down) to remove the spacer material from and thus expose horizontally oriented surfaces, including the upper surface of the lower thickness portions 220b.

Figure 16:
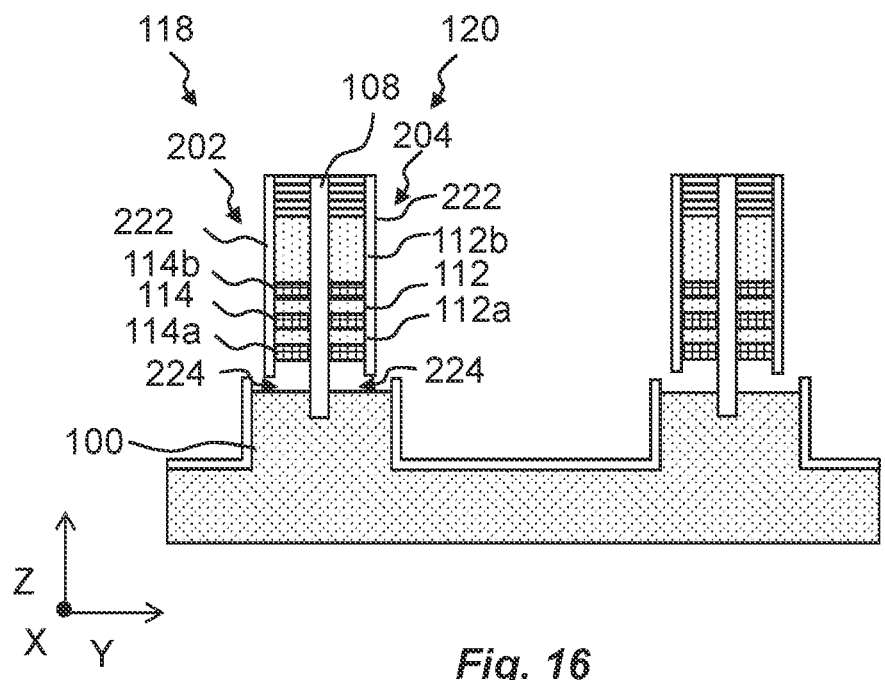

In FIG. 16, the bottom sacrificial layers 220 have been removed selectively to the upper sacrificial layers 112 and the channel layers 114 by etching the sacrificial material of the exposed upper surface of the lower thickness portion 220a while using the spacer layer 222 as an etch mask (e.g. step S14 of method 10 of FIG. 1). Despite presence of the spacer layer 222, an etching process with a selectivity towards the sacrificial material over the channel material may advantageously be used to counteract attack on the bottom-most channel layers 114a.

Figure 17:
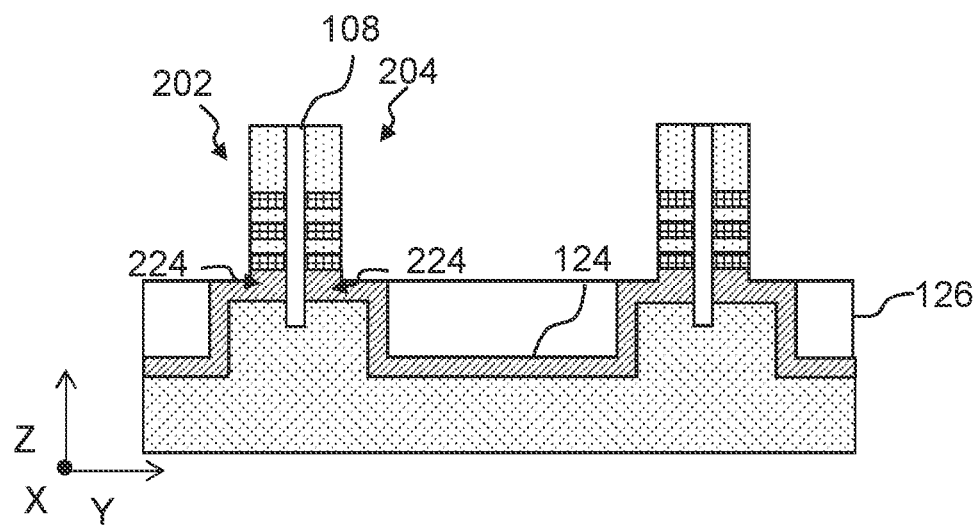

In FIG. 17 a bottom insulating material 124 has been deposited in the cavities 224 (e.g. step S16 of method 10 of FIG. 1). Similar to what was described in connection with FIGS. 4-6, bottom insulating material 124 may be conformally deposited and subsequently etched back together with a second insulating material 126 such that bottom insulating material 124 is removed from the layer stacks 202, 204 above a level of the recesses 224. The method may thereafter proceed as discussed above in connection with FIG. 7 and onwards (e.g. processing block 20 of method 10 of FIG. 1).

In the above the inventive concept has mainly been described with reference to a limited number of examples. However, as is readily appreciated by a person skilled in the art, other examples than the ones disclosed above are equally possible within the scope of the inventive concept, as defined by the appended claims.

The invention claimed is:

1. A method for forming a first and a second transistor structure in a first and a second device region of a substrate, respectively, each transistor structure comprising a source region, a drain region, a channel region extending between the source region and the drain region in a first direction along the substrate, and a gate stack at the channel region, wherein the first and second transistor structures are spaced apart in a second direction along the substrate, transverse to the first direction, by an insulating wall extending in the first direction, and the method comprising:
    forming on a semiconductor layer of the substrate a first semiconductor layer stack in the first device region and a second semiconductor layer stack in the second device region, each layer stack comprising in a bottom-up direction a first sacrificial layer a plurality of channel layers and a plurality of second sacrificial layers, the second sacrificial layers alternating the channel layers, and the channel layers being formed of a different material than the first and second sacrificial layers, wherein each first sacrificial layer comprises a lower thickness portion and an upper thickness portion on which a bottom-most channel layer is formed, wherein the lower thickness portion of each first sacrificial layer has a greater width than the upper thickness portion such that an upper surface of the lower thickness portion is exposed adjacent to the upper thickness portion, and wherein the layer stacks are spaced apart by a trench extending into the semiconductor layer of the substrate, the trench being filled with an insulating wall material to form the insulating wall; and
    processing the layer stacks to form the first and second transistor structures in the first and second device regions, respectively, the processing comprising forming released channel layer portions by etching the second sacrificial layers selectively to the channel layers, forming the source and drain regions and forming the gate stacks along the channel layer portions;
    the method further comprising, prior to said processing:
    forming a spacer layer on sidewall surfaces of the first and second layer stacks facing away from the insulating wall, the spacer layer covering sidewall surfaces of the channel layers and of the second sacrificial layers, and exposing at least the lower thickness portion of the first sacrificial layers, wherein forming the spacer layer comprises conformally depositing a spacer material over the first and second layer stacks, and etching back the deposited spacer material in a top-down direction such that the upper surface of the lower thickness portions is exposed and the spacer layer remains on the sidewall surfaces of the first and second layer stacks;
    by etching removing the first sacrificial layer of each layer stack to form a respective cavity on either sides of the insulating wall underneath the channel layers of the first and second layer stack, the channel layers being supported by the insulating wall, wherein the first sacrificial layer of each layer stack is removed selectively to the second sacrificial layers and the channel layers by etching the first sacrificial layers while using the spacer layer as an etch mask; and
    depositing a bottom insulating material in said cavities; wherein, subsequent to said processing, the bottom insulating material forms a bottom insulating layer underneath the source region, the drain region and the channel region on either side of the insulating wall.

2. A method according to claim 1, comprising conformally depositing the bottom insulating material over the layer stacks with a thickness such that said cavities are filled with the bottom insulating material, and subsequently removing the bottom insulating material from the layer stacks above a level of the cavities.

3. A method according to claim 2, further comprising depositing a second insulating material covering the layer stacks and the bottom insulating material thereon, and thereafter simultaneously etching back the second insulating material and the bottom insulating material in a top-down direction to expose the layer stacks above said level of the cavities.

4. A method according to claim 1, wherein the first and second sacrificial layers are formed of $Si_{1-y}Ge_y$, and the channel layers are formed of $Si_{1-z}Ge_z$, wherein $y>z$.

5. A method according to claim 1, wherein forming the layer stacks comprises:
   epitaxially growing layers of sacrificial material and layers of channel material, and
   patterning the epitaxially grown sacrificial and channel material layers to form the trench and the first and second layer stack.

6. A method according to claim 5, wherein the method comprises forming the trench and filling the trench with the insulating wall material prior to forming the first and second layer stacks.

7. A method according to claim 1, wherein the processing of the layer stacks further comprises:
   forming a sacrificial gate extending across the layer stacks and the insulating wall;
   etching the layer stacks on either sides of the sacrificial gate;
   forming the respective source and drain regions of the first and second transistor structures on either side of the sacrificial gate by epitaxy, wherein the source and drain regions are formed above the bottom insulating layer; and
   replacing the sacrificial gate by the gate stacks after forming the source and drain regions.

8. A method according to claim 7, further comprising:
   subsequent to said epitaxy, depositing a cover material covering the source and drain regions and surrounding the sacrificial gate; and
   removing the sacrificial gate to expose the first and second layer stack in a first and second gate trench, respectively, the first and second gate trenches being separated by the insulating wall;
   wherein the gate stacks thereafter are formed in the first and second gate trenches.

9. A method according to claim 8, further comprising, subsequent to removing the sacrificial gate and prior to forming the gate stacks, forming released channel layer portions by etching portions of the second sacrificial layers exposed in the first and second gate trenches, said etching being selective to the channel layers.

10. A method according to claim 1, wherein removing the sacrificial layer of each layer stack comprises simultaneously etching the sacrificial layers of the layer stacks from a side facing away from the insulating wall.

* * * * *